US008441846B2

(12) United States Patent
Kim

(10) Patent No.: US 8,441,846 B2
(45) Date of Patent: May 14, 2013

(54) SEMICONDUCTOR MEMORY DEVICE AND METHOD FOR TESTING THE SAME

(75) Inventor: Kyu Sung Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 353 days.

(21) Appl. No.: 12/828,019

(22) Filed: Jun. 30, 2010

(65) Prior Publication Data

US 2011/0267875 A1 Nov. 3, 2011

(30) Foreign Application Priority Data

Apr. 28, 2010 (KR) ........................ 10-2010-0039250

(51) Int. Cl.
*G11C 11/00* (2006.01)
(52) U.S. Cl.
USPC ........... 365/163; 365/100; 365/129; 365/148; 365/158
(58) Field of Classification Search ............. 365/46, 365/94, 100, 113, 129, 148, 158, 163; 257/2–5, 257/9, 296, 310, E21.35, E31.047, E27.006; 438/29, 95, 96, 166, 135, 240, 259, 365, 438/482, 486, 597, 785; 977/754
See application file for complete search history.

(56) References Cited

U.S. PATENT DOCUMENTS

| 7,102,935 B2* | 9/2006 | Miki et al. ............... 365/189.09 |
| 7,411,860 B2* | 8/2008 | Nii .......................... 365/230.05 |
| 2006/0092740 A1* | 5/2006 | Nii ............................... 365/221 |
| 2007/0263435 A1* | 11/2007 | Nii ............................... 365/182 |
| 2009/0052262 A1* | 2/2009 | Nii .......................... 365/189.14 |

FOREIGN PATENT DOCUMENTS

| KR | 1020080057385 A | 6/2008 |
| KR | 1020090002477 A | 1/2009 |

* cited by examiner

*Primary Examiner* — Harry W Byrne

(57) ABSTRACT

A semiconductor memory device includes a memory cell array configured to include a plurality of memory cells, a plurality of bit lines respectively coupled to the plurality of memory cells, a first power-supply voltage supplying circuit configured to provide a first power-supply voltage to the memory cell array through the plurality of bit lines, a second power-supply voltage supplying circuit configured to provide a second power-supply voltage to the memory cell array through the plurality of bit lines, a first address selection circuit configured to couple a bit line selected by a first selection address to the first power-supply voltage supplying circuit, and a second address selection circuit configured to couple a bit line selected by a second selection address to the second power-supply voltage supplying circuit.

16 Claims, 7 Drawing Sheets

SEMICONDUCTOR MEMORY DEVICE AND METHOD FOR TESTING THE SAME

CROSS-REFERENCE TO RELATED APPLICATION

The priority of Korean patent application No. 10-2010-0039250 filed on 28 Apr. 2010, the disclosure of which is hereby incorporated in its entirety by reference, is claimed.

BACKGROUND OF THE INVENTION

Embodiments of the present invention relate to a semiconductor memory device and a method for testing the same.

Generally, a semiconductor memory device stores data in a unit memory cell. The unit memory cell includes a memory element for storing the data therein, and the data is input or output through a bit line to or from the memory element.

Since the semiconductor memory device includes a plurality of unit memory cells, a cell array is comprised of a plurality of unit memory cells, such that data is input and output through bit lines from respective unit memory cells.

In recent times, as the semiconductor memory device becomes highly integrated, one cell array includes an increasing number of unit memory cells, and thus the number of bit lines coupled to the cell array is also increasing.

Since the semiconductor memory device should be designed to include a large number of unit memory cells and a large number of bit lines in a small area, neighboring bit lines may be unavoidably coupled to each other, or parasitic capacitance may occur. As a result, a current may flow in undesired bit lines, such that data is read or written from or in an unexpected or wrong unit memory cell.

BRIEF SUMMARY OF THE INVENTION

Various embodiments of the present invention are directed to providing a semiconductor memory device that substantially obviates one or more problems due to limitations and disadvantages of the related art.

Embodiments of the present invention relate to a semiconductor memory device which applies different power-supply voltages to bit lines coupled to a cell array and removes a current path between bit lines unexpectedly formed in a process of manufacturing the semiconductor memory device, and a method for testing the semiconductor memory device.

In accordance with one embodiment of the present invention, there is provided a semiconductor memory device including a memory cell array configured to include a plurality of memory cells, a plurality of bit lines respectively coupled to the plurality of memory cells, a first power-supply voltage supplying circuit configured to provide a first power-supply voltage to the memory cell array through the plurality of bit lines, a second power-supply voltage supplying circuit configured to provide a second power-supply voltage to the memory cell array through the plurality of bit lines, a first address selection circuit configured to receive a bit line address as an input, and couple a bit line selected by a first selection address to the first power-supply voltage supplying circuit, and a second address selection circuit configured to receive the bit line address as an input, and couple a bit line selected by a second selection address to the second power-supply voltage supplying circuit.

In accordance with another embodiment of the present invention, there is provided a method for testing a semiconductor memory device which includes a memory cell array having a plurality of memory cells and a plurality of bit lines respectively coupled to the plurality of memory cells, the method including selecting one or more bit lines from among the plurality of bit lines, applying a first power-supply voltage to the one or more bit lines, selecting other bit lines except for the selected bit line, and applying a second power-supply voltage to the other bit lines.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
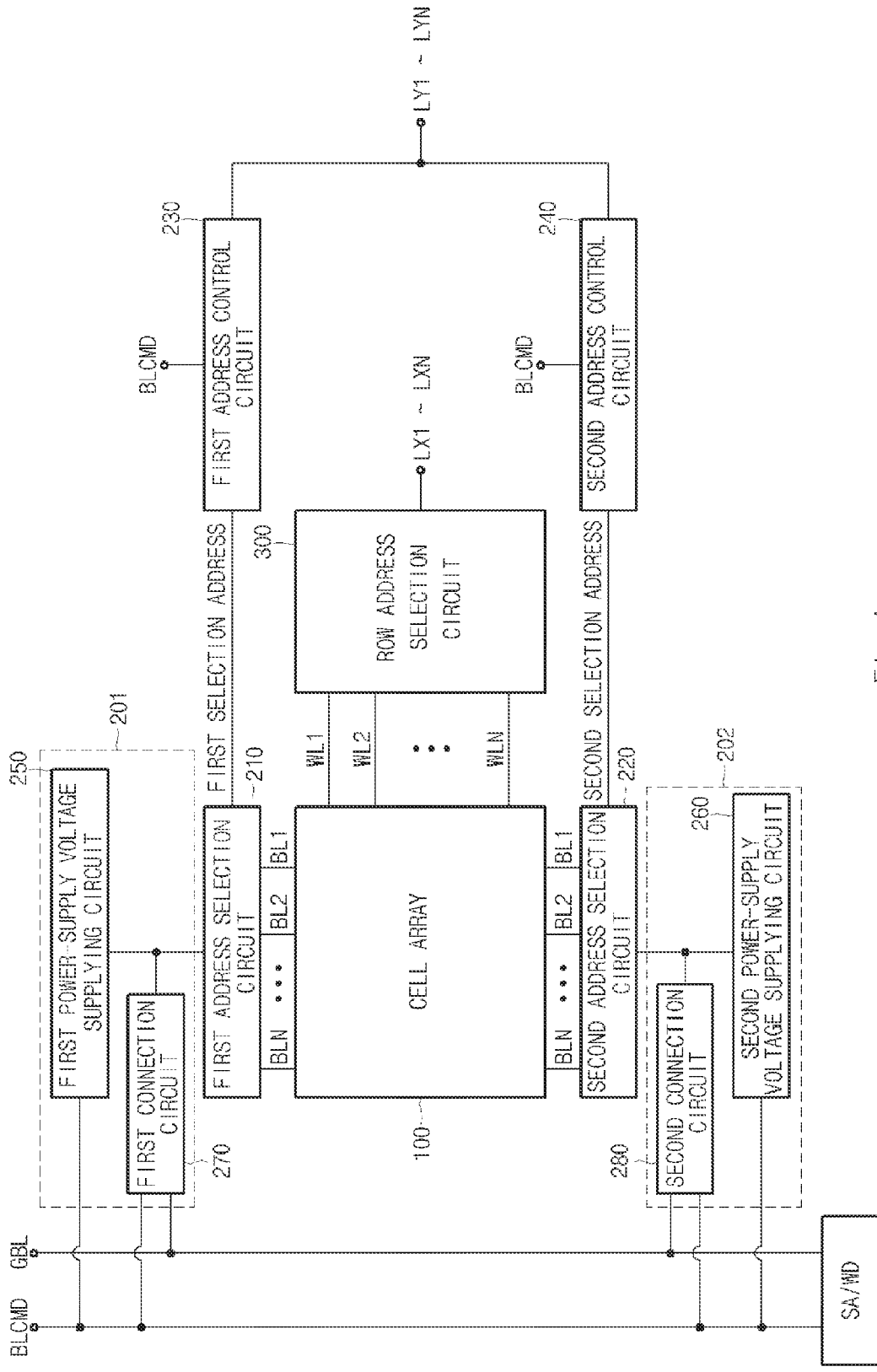
FIG. 1 is a block diagram illustrating a semiconductor memory device according to an embodiment of the present invention.

FIG. 1 is a block diagram illustrating a semiconductor memory device according to an embodiment of the present invention.

Referring to FIG. 1, the semiconductor memory device includes a cell array 100, a first power-supply voltage supplying unit 201, a second power-supply voltage supplying unit 202, a first address selection circuit 210, a second address selection circuit 220, a first address control circuit 230, a second address control circuit 240, a sense-amplifier (SA)/write driver (WD), and a row address selection circuit 300.

The first power-supply voltage supplying unit 201 includes a first power-supply voltage supplying circuit 250 and a first connection circuit 270. The second power-supply voltage supplying unit 202 includes a second power-supply voltage supplying circuit 260 and a second connection circuit 280.

The cell array 100 includes a plurality of unit memory cells. The unit memory cell may store data in various kinds of memory elements. For example, the unit memory cell may use a capacitor or a phase change resistance element as a memory element. According to embodiments of the present invention, there is no limitation in categories of memory elements, such that any kind of memory element can be used in the semiconductor memory device without any restriction.

Each unit memory cell contained in the cell array 100 is coupled to external circuits of the cell array 100 through bit lines BL. Since a plurality of unit memory cells may be used, a plurality of bit lines may be used. A current signal from the SA/WD is provided to a memory element of each unit memory cell through bit lines BL1~BLN.

When data is read/written from/to a specific unit memory cell among a plurality of unit memory cells, it is necessary to select the specific unit memory cell and a bit line BL connected to the specific unit memory cell.

In the semiconductor memory device according to an embodiment of the present invention, information for identifying the plurality of unit memory cells and corresponding bit lines BL connected to the unit memory cells may be bit line addresses LY1~LYN. For example, if the bit line address LY1 is activated, a bit line corresponding to the bit line address LY1 and a unit memory cell coupled to the bit line are also activated.

The first address control circuit 230 receives the bit line addresses LY1~LYN as input signals, and activates a specific bit line address LY in response to a bit line control signal BLCMD.

The bit line control signal BLCMD may be input from an external part of the semiconductor memory device through an input/output (I/O) pad.

In accordance with another embodiment, the bit line control signal BLCMD may be generated by a bit line control signal generator (not shown) using internal signals of the semiconductor memory device.

The specific bit line address LY activated by the bit line control signal BLCMD refers to a first selection address. The first selection address includes information for one or more bit lines to be activated among the bit line addresses LY1~LYN.

The first address selection circuit 210 activates a corresponding bit line BL according to the first selection address received from the first address control circuit 230. If the bit line BL is activated, a first power-supply voltage from the first power-supply voltage supplying circuit 250 may be input to the cell array 100 through the activated bit line BL.

That is, the first address selection circuit 210 may couple the first power-supply voltage supplying circuit 250 to the activated bit line BL in response to the first selection address. The first address selection circuit 210 provides the first power-supply voltage only to the activated bit line BL among the bit lines BL1~BLN.

For example, the first address selection circuit 210 may provide the first power-supply voltage to the bit line BL1, the bit line BL3, the bit line BL5, the bit line BL7, and the like.

In another example, the first address selection circuit 210 may provide the first power-supply voltage to the bit line BL1, the bit line BL4, the bit line BL5, the bit line BL8, the bit line BL9, and the like.

The second address control circuit 240 receives the bit line addresses LY1~LYN as input signals, such that it activates a specific bit line address LY in response to the bit line control signal BLCMD. The bit line address LY activated by the bit line control signal BLCMD refers to a second selection address. The second selection address may include information for one or more bit lines BL to be activated among the bit line addresses LY1~LYN.

The second address selection circuit 220 may activate a corresponding bit line BL in response to the second selection address from the second address control circuit 240. If the bit line BL is activated, a second power-supply voltage from the second power-supply voltage supplying circuit 260 may be input to the cell array 100 through the activated bit line BL.

That is, the second address selection circuit 220 may couple the second power-supply voltage supplying circuit 260 to the activated bit line BL in response to the second selection address. The second address selection circuit 220 provides the second power-supply voltage only to the activated bit line BL among the bit lines BL1~BLN.

For example, when the first address selection circuit 210 provides the first power-supply voltage to the bit line BL1, the bit line BL3, the bit line BL5, the bit line BL7, and the like, the second address selection circuit 220 may provide the second power-supply voltage to the bit line BL2, the bit line BL4, the bit line BL6, the bit line BL8, and the like.

Meanwhile, when the first address selection circuit 210 provides the first power-supply voltage to the bit line BL1, the bit line BL4, the bit line BL5, the bit line BL8, the bit line BL9, and the like, the second address selection circuit 220 may provide the second power-supply voltage to the bit line BL2, the bit line BL3, the bit line BL6, the bit line BL7, and the like.

As described above, the first address selection circuit 210 and the second address selection circuit 220 do not simultaneously provide the first power-supply voltage and the second power-supply voltage to the same bit line BL, but exclusively provide the first power-supply voltage and the second power-supply voltage in such a manner that bit lines BL are not overlapped with each other.

In accordance with another embodiment, the first address selection circuit 210 and the second address circuit 220 may respectively provide the first power-supply voltage and the second power-supply voltage to bit lines BL arranged in an alternate form.

The first power-supply voltage supplying circuit 250 provides the first power-supply voltage to the cell array 100 according to the bit line control signal BLCMD. The first power-supply voltage may have a power-supply voltage (VDD) level.

For example, if the bit line control signal BLCMD is activated, the first power-supply voltage is provided to the cell array 100 through the first address selection circuit 210. On the other hand, if the bit line control signal BLCMD is deactivated, the first power-supply voltage may not be provided to the cell array 100 through the first address selection circuit 210.

The second power-supply voltage supplying circuit 260 may provide the second power-supply voltage to the cell array 100 according to the bit line control signal BLCMD. The second power-supply voltage may have a ground voltage (VSS) level.

For example, if the bit line control signal BLCMD is activated, the second power-supply voltage is provided to the cell array 100 through the second address selection circuit 220. On the other hand, if the bit line control signal BLCMD is deactivated, the second power-supply voltage may not be provided to the cell array 100 through the second address selection circuit 220.

When the first power-supply voltage is at a VDD level, and the second power-supply voltage is at a VSS level, a difference in potential is generated between one bit line receiving the first power-supply voltage and the other bit line receiving the second power-supply voltage.

For example, if the first power-supply voltage having the VDD level is provided to the bit line BL1, and the second power-supply voltage having the VSS level is provided to the bit line BL2, an unexpected current path may be generated between the bit line BL1 and the bit line BL2 in a process of manufacturing the semiconductor memory device since the bit line BL1 and the bit line BL2 may be in the neighborhood.

In this case, at one step of a semiconductor memory device test process, if a potential difference is given to the bit line BL1 and the bit line BL2, a current signal flows between the bit line BL1 and the other bit line BL2, such that the unexpected current path may be burnt.

As described above, the semiconductor memory device according to the embodiments of the present invention provides different power-supply voltages to different bit lines BL, and thus supplying the different power-supply voltages may be used to test the semiconductor memory device.

Although the first power-supply voltage and the second power-supply voltage are described as the VDD level and the VSS level, respectively, in the above embodiment, it should be noted that the scope or spirit of the present invention is not limited thereto and other examples may also be used without any restriction.

For example, in order to increase a potential difference between the first power-supply voltage and the second power-supply voltage, the second power-supply voltage may be set to a negative (−) voltage level, and the first power-supply voltage may be set to a pumping voltage (VPP) level greater than the VDD level.

In the semiconductor memory device according to the embodiments of the present invention, when the SA/WD performs a read/write operation, a read/write current signal is provided to a corresponding unit memory cell contained in the cell array 100.

In the semiconductor memory device according to the embodiments of the present invention, the SA/WD provides the cell array 100 with a read/write current signal through a global bit line GBL.

The global bit line GBL may be selectively coupled to the bit lines BL1~BLN through the first address selection circuit 210.

The first address selection circuit 210 couples only the bit line selected by the first selection address to the global bit line GBL.

The read/write current signal is applied to a corresponding unit memory cell through the selected bit line, such that the read/write operation can be carried out.

The first connection circuit 270 may selectively couple the global bit line GBL to the first address selection circuit 210 according to the bit line control signal BLCMD.

As described above, if the bit line control signal BLCMD is activated, the first power-supply voltage supplying circuit 250 provides the first power-supply voltage to the cell array 100. In this case, if the read/write current signal is input from the SA/WD through the global bit line GBL, the first power-supply voltage and the read/write current signal are mixed with each other, such that an unexpected faulty operation occurs in the first power-supply voltage supplying circuit 250.

If the bit line control signal BLCMD is activated, since the first connection circuit 270 disconnects the global bit line GBL from the first address selection circuit 210, the read/write current signal from the SA/WD is not input to the first address selection circuit 210.

In contrast, if the bit line control signal BLCMD is deactivated, the first power-supply voltage supplying circuit 250 does not provide the first power-supply voltage to the cell array 100 any longer, and the first connection circuit 270 couples the global bit line GBL to the first address selection circuit 210, such that the read/write operation can be carried out.

In the meantime, in the semiconductor memory device according to the embodiments of the present invention, the global bit line GBL may be selectively coupled to the bit lines BL1~BLN through the second address selection circuit 220.

The second address selection circuit 220 couples only some bit lines selected by the second selection address to the global bit line GBL. The read/write current signal is input to a corresponding unit memory cell through the selected bit line, such that the read/write operation can be carried out.

The second connection circuit 280 may selectively couple the global bit line GBL to the second address selection circuit 220 according to the bit line control signal BLCMD.

As described above, if the bit line control signal BLCMD is activated, the second power-supply voltage supplying circuit 260 provides the second power-supply voltage to the cell array 100. In this case, if the read/write current signal is input from the SA/WD through the global bit line GBL, the second power-supply voltage and the read/write current signal are mixed with each other, such that an unexpected faulty operation occurs in the second power-supply voltage supplying circuit 260.

If the bit line control signal BLCMD is activated, the second connection circuit 280 disconnects the global bit line GBL from the second address selection circuit 220, such that the read/write current signal from the SA/WD is not input to the second address selection circuit 220.

In contrast, if the bit line control signal BLCMD is deactivated, the second power-supply voltage supplying circuit 260 does not provide the second power-supply voltage to the second address selection circuit 220 any longer, and the second connection circuit 280 couples the global bit line GBL to the second address selection circuit 220, such that the read/write operation can be carried out.

The row address selection circuit 300 may select a specific word line among several word lines WL1~WLM in response to row addresses LX1~LXM.

For example, if the row addresses LX1 and LX3 are activated and input, the word lines WL1 and WL3 become activated. In this case, unit memory cells coupled to the word lines WL1 and WL3 are selected, such that a read/write operation for the corresponding unit memory cells can be carried out.

Figure 2:
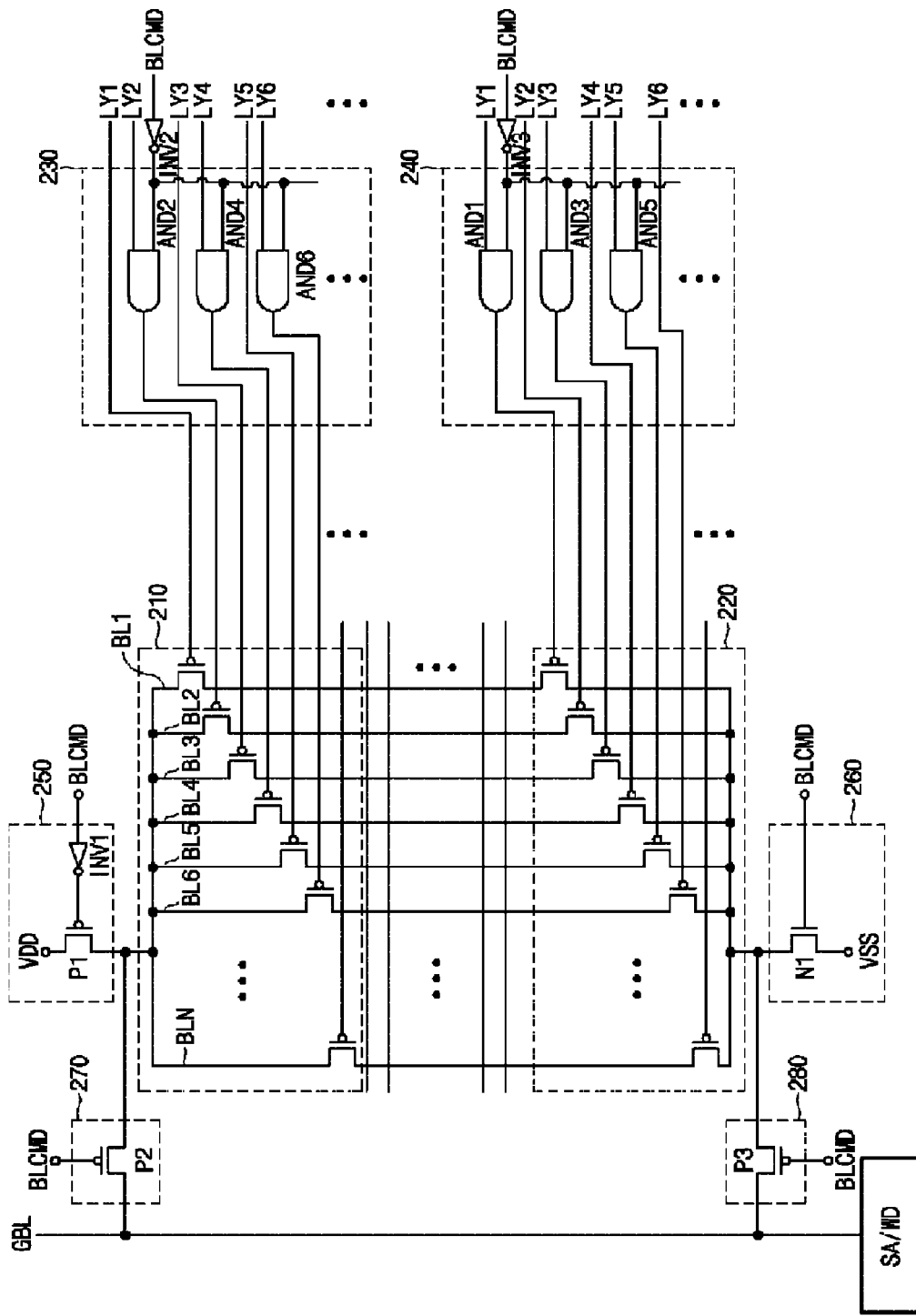
FIG. 2 is a circuit diagram illustrating a semiconductor memory device according to an embodiment of the present invention.

FIG. 2 is a circuit diagram illustrating a semiconductor memory device according to an embodiment of the present invention. Referring to FIG. 2, the semiconductor memory device is shown as a phase change memory device as an example. However, since the scope or spirit of the present invention is not limited only to the phase change memory device, other kinds of semiconductor memory devices may also be applied to an embodiment of the present invention without any restriction.

The semiconductor memory device in FIG. 2 includes a cell array 100, a first address selection circuit 210, a second address selection circuit 220, a first address control circuit 230, a second address control circuit 240, a first power-supply voltage supplying circuit 250, a second power-supply voltage supplying circuit 260, a first connection circuit 270, a second connection circuit 280, and a sense-amplifier (SA)/write driver (WD).

Referring to FIG. 2, in the semiconductor memory device according to an embodiment of the present invention, bit lines BL1~BLN are crossed with word lines WL1~WLM. A unit memory cell is coupled between each bit line BL and each word line WL.

Figure 3:
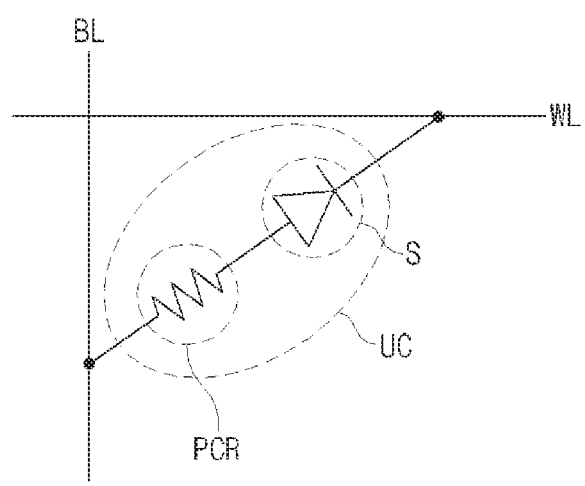
FIG. 3 shows a unit memory cell contained in a cell array of the semiconductor memory device in FIG. 1 according to an embodiment of the present invention.

FIG. 3 shows a unit memory cell UC contained in the cell array 100 of the semiconductor memory device in FIG. 1 according to an embodiment of the present invention.

Referring to FIG. 3, in the semiconductor memory device according to an embodiment of the present invention, one side of the unit memory cell UC is coupled to a bit line BL, and the other side is coupled to a word line WL.

The unit memory cell UC includes a phase change resistance element PCR and a switching element S. The read/write current signal received through the bit line BL flows to the word line WL through the phase change resistance element PCR and the switching element S.

The phase change resistance element PCR may be crystallized or non-crystallized according to the magnitude of a passing current signal and a flowing time of this current signal. The phase change resistance element PCR may map data "0" to its crystalline state and data "1" to its non-crystalline state to store data therein.

The switching element S allows a current signal to flow in only one direction from the bit line BL to the word line WL. The switching element S may include any of a metal-oxide-semiconductor (MOS) transistor, a bipolar junction transistor (BJT), a diode, and the like.

Figure 4:
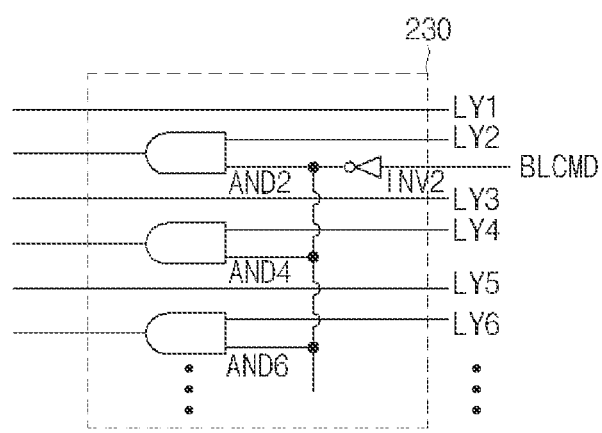
FIG. 4 is a circuit diagram illustrating a first address control circuit of the semiconductor memory device in FIG. 1 according to an embodiment of the present invention.

FIG. 4 is a circuit diagram illustrating the first address control circuit 230 of the semiconductor memory device in FIG. 1 according to an embodiment of the present invention.

Referring to FIG. 4, the first address control circuit 230 receives the bit line addresses LY1~LYN as input signals, and outputs the first selection address in response to the bit line control signal BLCMD.

For example, if the bit line control signal BLCMD having a high level is input to the first address control circuit 230, an inverter INV2 inverts the bit line control signal BLCMD, and outputs an inverted bit line control signal BLCMD having a low level.

Logic elements AND2, AND4 and AND6 receive the inverted bit line control signal BLCMD and respectively receive the bit line addresses LY2, LY4 and LY6. Since the inverted bit line control signal BLCMD is at the low level, each of the logic elements AND2, AND4 and AND6 outputs a low-level signal irrespective of the bit line addresses LY2, LY4 and LY6. The low-level signal output from each of the logic elements AND2, AND4 and AND6 may be the first selection address.

Figure 5:
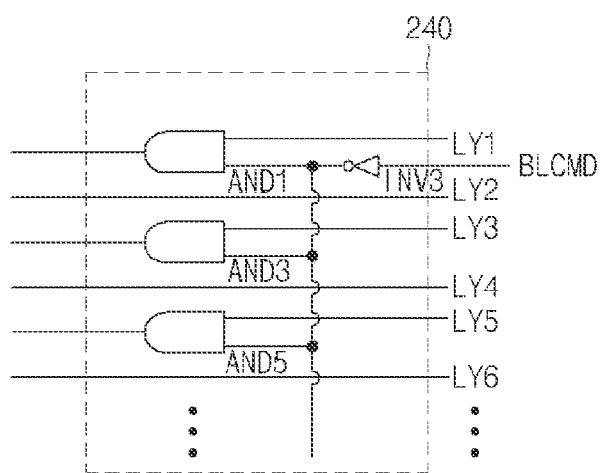
FIG. 5 is a circuit diagram illustrating a second address control circuit of the semiconductor memory device in FIG. 1 according to an embodiment of the present invention.

FIG. 5 is a circuit diagram illustrating the second address control circuit 240 of the semiconductor memory device in FIG. 1 according to an embodiment of the present invention.

Referring to FIG. 5, the second address control circuit 240 receives the bit line addresses LY1~LYN as input signals, and outputs the second selection address in response to the bit line control signal BLCMD.

For example, if the bit line control signal BLCMD having a high level is input to the second address control circuit 240, an inverter INV3 inverts the bit line control signal BLCMD, such that it outputs an inverted bit line control signal BLCMD having a low level.

Logic elements AND1, AND3 and AND5 receive the inverted bit line control signal BLCMD and respectively receive the bit line addresses LY1, LY3 and LY5. Since the inverted bit line control signal BLCMD is at the low level, each of the logic elements AND1, AND3 and AND5 outputs a low-level signal irrespective of the bit line addresses LY1, LY3 and LY5. The low-level signal output from each of the logic elements AND1, AND3 and AND5 may be the second selection address.

Referring back to FIG. 2, when testing the semiconductor memory device according to an embodiment of the present invention, it is assumed that the bit line addresses LY1~LYN are not input, and only the bit line control signal BLCMD is activated. In this case, since the bit line addresses LY1, LY3 and LY5 are in a floating state, PMOS transistors contained in the first address selection circuit 210 corresponding to the floating addresses may not be turned on.

In another embodiment, the high-level bit line addresses LY1~LYN may be input to the semiconductor memory device such that PMOS transistors contained in the first address selection circuit 210 corresponding to the bit line addresses LY1, LY3 and LY5 are not turned on.

Meanwhile, the first address selection circuit 210 may turn on PMOS transistors coupled to the bit lines BL1, BL3 and BL5 in response to the first selection address. When the corresponding PMOS transistors are turned on, the first power-supply voltage from the first power-supply voltage supplying circuit 250 is provided to the cell array 100 through the bit lines BL1, BL3 and BL5.

Likewise, in case of testing the semiconductor memory device according to an embodiment of the present invention, it is assumed that the bit line addresses LY1~LYN are not input, and only the bit line control signal BLCMD is activated. In this case, since the bit line addresses LY2, LY4 and LY6 are in a floating state, PMOS transistors contained in the second address selection circuit 220 corresponding to the floating addresses may not be turned on.

In another embodiment, the high-level bit line addresses LY1~LYN may be input to the semiconductor memory device such that PMOS transistors contained in the second address selection circuit 220 corresponding to the bit line addresses LY2, LY4 and LY6 are not turned on.

In the meantime, the second address selection circuit 220 may turn on PMOS transistors coupled to the bit lines BL2, BL4 and BL6 in response to the second selection address. When the corresponding PMOS transistors are turned on, the second power-supply voltage from the second power-supply voltage supplying circuit 260 is provided to the cell array 100 through the bit lines BL2, BL4 and BL6.

In the semiconductor memory device according to an embodiment of the present invention, the different power-supply voltages may be alternately supplied to odd-numbered bit lines and even-numbered bit lines among the bit lines BL1~BLN.

As described above, in the semiconductor memory device according to an embodiment of the present invention, a potential difference is generated between neighboring bit lines due to a difference in potential between the first power-supply voltage and the second power-supply voltage. Therefore, in the test operation of the semiconductor memory device, an unexpected current path generated between neighboring bit lines in the process of manufacturing the semiconductor memory device may be removed by energy generated by the above-mentioned potential difference between the first power-supply voltage and the second power-supply voltage.

Figure 6:
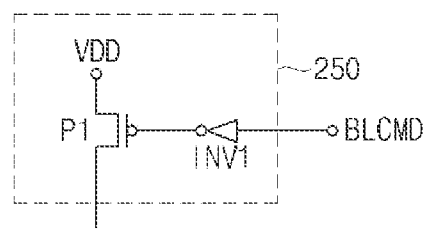
FIG. 6 is a circuit diagram illustrating a first power-supply voltage supplying circuit of the semiconductor memory device in FIG. 1 according to an embodiment of the present invention.

FIG. 6 is a circuit diagram illustrating the first power-supply voltage supplying circuit 250 of the semiconductor memory device in FIG. 1 according to an embodiment of the present invention.

Referring to FIG. 6, the first power-supply voltage supplying circuit 250 outputs the first power-supply voltage received through a first power-supply voltage supplying terminal according to the bit line control signal BLCMD. If the first power-supply voltage supplying circuit 250 receives the bit line control signal BLCMD, an inverter INV1 inverts the received bit line control signal BLCMD. A PMOS transistor P1 may be turned on or off according to the inverted bit line control signal BLCMD, such that it outputs the first power-supply voltage.

For example, if the high-level bit line control signal BLCMD is input to the first power-supply voltage supplying circuit 250, the inverter INV1 inverts the high-level bit line control signal BLCMD to output the inverted bit line control signal BLCMD having a low level, and thus the PMOS transistor P1 is turned on. As a result, the first power-supply voltage is output by the PMOS transistor P1.

Although the first power-supply voltage is shown as the VDD level, the first power-supply voltage may be the VPP level which is higher than the VDD level.

Figure 7:
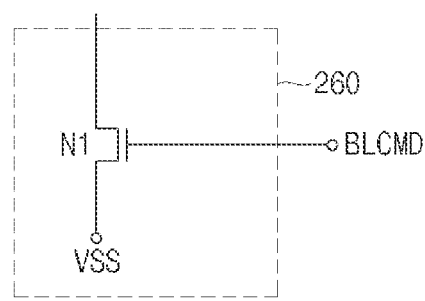
FIG. 7 is a circuit diagram illustrating a second power-supply voltage supplying circuit of the semiconductor memory device in FIG. 1 according to an embodiment of the present invention.

FIG. 7 is a circuit diagram illustrating the second power-supply voltage supplying circuit 260 of the semiconductor memory device in FIG. 1 according to an embodiment of the present invention.

Referring to FIG. 7, the second power-supply voltage supplying circuit 260 outputs the second power-supply voltage received through a second power-supply voltage supplying terminal according to the bit line control signal BLCMD. The second power-supply voltage supplying circuit 260 turns on or off an NMOS transistor N1 according to the bit line control signal BLCMD to output the second power-supply voltage.

For example, if the high-level bit line control signal BLCMD is input to the second power-supply voltage supplying circuit 260, the NMOS transistor N1 is turned on, and thus the second power-supply voltage is output by the NMOS transistor N1.

Although the second power-supply voltage is shown as the VSS level, the second power-supply voltage may be a negative (−) voltage level which is lower than the VSS level.

In the semiconductor memory device according to an embodiment of the present invention, if the bit line control signal BLCMD goes to the high level, the first power-supply voltage supplying circuit 250 and the second power-supply voltage supplying circuit 260 are activated, such that the first power-supply voltage and the second power-supply voltage are provided to the cell array 100.

In accordance with another embodiment, when the bit line control signal BLCMD goes to the low level, the first power-supply voltage supplying circuit 250 and the second power-supply voltage supplying circuit 260 are activated, such that the first power-supply voltage and the second power-supply voltage may be provided to the cell array 100.

In accordance with the embodiments of the present invention, the semiconductor memory device should be designed in such a manner that both of the first power-supply voltage supplying circuit 250 and the second power-supply voltage supplying circuit 260 are activated or inactivated at the same time in response to the bit line control signal BLCMD.

Figure 8:
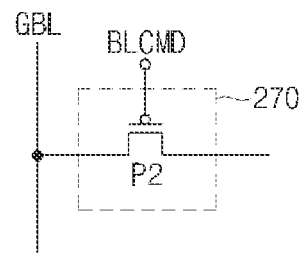
FIG. 8 is a circuit diagram illustrating a first connection circuit of the semiconductor memory device in FIG. 1 according to an embodiment of the present invention.

FIG. 8 is a circuit diagram illustrating the first connection circuit 270 of the semiconductor memory device in FIG. 1 according to an embodiment of the present invention.

Referring to FIG. 8, the first connection circuit 270 selectively couples the global bit line GBL to the first address selection circuit 210 according to the bit line control signal BLCMD.

For example, if the high-level bit line control signal BLCMD is input to the first connection circuit 270, the PMOS transistor P2 is turned off, such that the global bit line GBL and the first address selection circuit 210 are disconnected from each other. As previously stated above, if the high-level bit line control signal BLCMD is input, the first power-supply voltage is applied from the first power-supply voltage supplying circuit 250 to the first address selection circuit 210. When the read/write current signal is applied through the global bit line GBL while the first power-supply voltage is provided to the cell array 100, the current signal caused by the first power-supply voltage and the read/write current signal are mixed with each other.

Therefore, the first connection circuit 270 substantially prevents the read/write current signal from being applied to the cell array 100 while the first power-supply voltage is provided to the cell array 100, such that no current signals are mixed.

Figure 9:
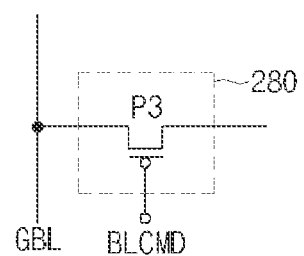
FIG. 9 is a circuit diagram illustrating a second connection circuit of the semiconductor memory device in FIG. 1 according to an embodiment of the present invention.

FIG. 9 is a circuit diagram illustrating the second connection circuit 280 of the semiconductor memory device in FIG. 1 according to an embodiment of the present invention.

Referring to FIG. 9, the second connection circuit 280 selectively couples the global bit line GBL to the second address selection circuit 220 according to the bit line control signal BLCMD.

For example, if the high-level bit line control signal BLCMD is input to the second connection circuit 280, the PMOS transistor P3 is turned off, such that the global bit line GBL and the second address selection circuit 220 are disconnected from each other. As previously stated above, if the high-level bit line control signal BLCMD is input, the second power-supply voltage is applied from the second power-supply voltage supplying circuit 260 to the second address selection circuit 220. When the read/write current signal is applied through the global bit line GBL while the second power-supply voltage is provided to the cell array 100, the current signal caused by the second power-supply voltage and the read/write current signal are mixed with each other.

Therefore, the second connection circuit 280 substantially prevents the read/write current signal from being applied to the cell array 100 while the second power-supply voltage is provided to the cell array 100, such that no current signals are mixed.

The semiconductor memory device according to an embodiment of the present invention may operate in a test mode or a read/write mode according to the bit line control signal BLCMD.

For example, as can be seen from the circuit diagram of FIG. 2, when the high-level bit line control signal BLCMD is input to the semiconductor memory device, the global bit line GBL is uncoupled to the first address selection circuit 210 and the second address selection circuit 220, and the first power-supply voltage and the second power-supply voltage are applied to corresponding bit lines of the cell array 100. The above-mentioned case is defined as the test mode, and all leakage current paths generable among the bit lines BL1~BLN can be removed.

In the meantime, if the low-level bit line control signal BLCMD is input to the semiconductor memory device, the global bit line GBL is coupled to the first address selection circuit 210 and the second address selection circuit 220, and the supplying of the first power-supply voltage and the second power-supply voltage is cut off. At this time, the SA/WD applies the read/write current signal to the first and second address selection circuits 210 and 220 through the global bit line GBL, such that the read/write operations can be carried out.

As apparent from the above description, the semiconductor memory device according to the embodiments of the present invention applies different power-supply voltages to a plurality of bit lines, which can remove a current path that may be unexpectedly generated between bit lines during manufacturing of the semiconductor memory device. Since the unexpected current paths formed among the bit lines may be removed according to various embodiments of the present invention, a faulty operation or malfunction generated in reading/writing data can be substantially prevented.

Those skilled in the art will appreciate that the present invention may be carried out in other ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
   a memory cell array including a plurality of memory cells;
   a plurality of bit lines coupled to the plurality of memory cells;
   a first power-supply voltage supplying circuit configured to provide a first power-supply voltage to the memory cell array through the plurality of bit lines;
   a second power-supply voltage supplying circuit configured to provide a second power-supply voltage to the memory cell array through the plurality of bit lines;
   a first address selection circuit configured to receive a first selection address, and couple a bit line selected by the first selection address to the first power-supply voltage supplying circuit; and
   a second address selection circuit configured to receive a second selection address, and couple a bit line selected by the second selection address to the second power-supply voltage supplying circuit.

2. The semiconductor memory device according to claim 1, wherein the first power-supply voltage supplying circuit provides the first power-supply voltage to the memory cell array according to a bit line control signal.

3. The semiconductor memory device according to claim 2, wherein the second power-supply voltage supplying circuit provides the second power-supply voltage to the memory cell array according to the bit line control signal.

4. The semiconductor memory device according to claim 3, further comprising:
   a first address control circuit configured to generate the first selection address according to the bit line control signal.

5. The semiconductor memory device according to claim 4, further comprising:
   a second address control circuit configured to generate the second selection address according to the bit line control signal.

6. The semiconductor memory device according to claim 5, wherein the bit line selected by the first selection address is different from the bit line selected by the second selection address.

7. The semiconductor memory device according to claim 5, wherein the bit line selected by the first selection address and the bit line selected by the second selection address are alternately arranged.

8. The semiconductor memory device according to claim 1, further comprising:
   a global bit line coupled to the plurality of bit lines via first and second address selection circuits.

9. The semiconductor memory device according to claim 8, further comprising:
   a sense-amplifier configured to sense and amplify a current signal flowing through the global bit line.

10. The semiconductor memory device according to claim 8, further comprising:
    a first connection circuit configured to couple the global bit line to the first address selection circuit according to the bit line control signal.

11. The semiconductor memory device according to claim 10, wherein the first address selection circuit is disconnected from the global bit line when the first power-supply voltage is supplied to the memory cell array.

12. The semiconductor memory device according to claim 8, further comprising:
    a second connection circuit configured to couple the global bit line to the second address selection circuit according to the bit line control signal.

13. The semiconductor memory device according to claim 12, wherein the second address selection circuit is disconnected from the global bit line when the second power-supply voltage is supplied to the memory cell array.

14. The semiconductor memory device according to claim 1, wherein the first address selection circuit is configured to couple the bit line selected by the first selection address to the first power-supply voltage supplying circuit if the first power-supply voltage supplying circuit provides the first power-supply voltage to the memory cell array.

15. The semiconductor memory device according to claim 1, wherein the second address selection circuit is configured to couple the bit line selected by the second selection address to the second power-supply voltage supplying circuit if the second power-supply voltage supplying circuit provides the second power-supply voltage to the memory cell array.

16. The semiconductor memory device according to claim 1, wherein each of the memory cells includes a phase change resistance element.

* * * * *